United States Patent [19]
Matsuoka

[11] Patent Number: 5,389,819
[45] Date of Patent: Feb. 14, 1995

[54] SOCKET FOR AN IC CARRIER HAVING A FLEXIBLE WIRING SHEET SUPERIMPOSED OVER AN IC BODY AND AN ELASTIC BACKUP MEMBER ELASTICALLY PRESSING THE FLEXIBLE WIRING SHEET INTO CONTACT WITH THE IC BODY

[75] Inventor: Noriyuki Matsuoka, Yokohama, Japan

[73] Assignee: Yamaichi Electronics Co., Ltd., Tokyo, Japan

[21] Appl. No.: 164,454

[22] Filed: Dec. 9, 1993

[30] Foreign Application Priority Data

Dec. 10, 1992 [JP] Japan .................... 4-353089

[51] Int. Cl.⁶ ............... H01L 23/42; H01L 23/44; H01L 23/46
[52] U.S. Cl. .................... 257/727; 257/690; 439/71
[58] Field of Search ............ 257/726, 727, 718, 719, 257/690; 439/68, 71, 72, 73

[56] References Cited

U.S. PATENT DOCUMENTS

| | | | |
|---|---|---|---|
| 4,936,784 | 6/1990 | Saito | 439/71 |
| 4,954,878 | 9/1990 | Fox et al. | 439/68 |
| 4,969,828 | 11/1990 | Bright et al. | 439/68 |
| 5,059,129 | 10/1991 | Brodsky et al. | 439/71 |
| 5,086,337 | 2/1992 | Noro et al. | 257/726 |
| 5,088,190 | 2/1992 | Malhi et al. | 257/727 |

*Primary Examiner*—Andrew J. James
*Assistant Examiner*—S. V. Clark
*Attorney, Agent, or Firm*—Wenderoth, Lind & Ponack

[57] ABSTRACT

An IC carrier has an IC body and a flexible wiring sheet superimposed on and contacted with the IC body. The carrier is loaded in a socket so that the wiring sheet may contact the socket. The socket comprises an elastic backup member for elastically pressing the superimposed portion of the wiring sheet so as to contact with the IC body. An operating device deflects the elastic backup member between the pressing position and a press-releasing position.

16 Claims, 6 Drawing Sheets

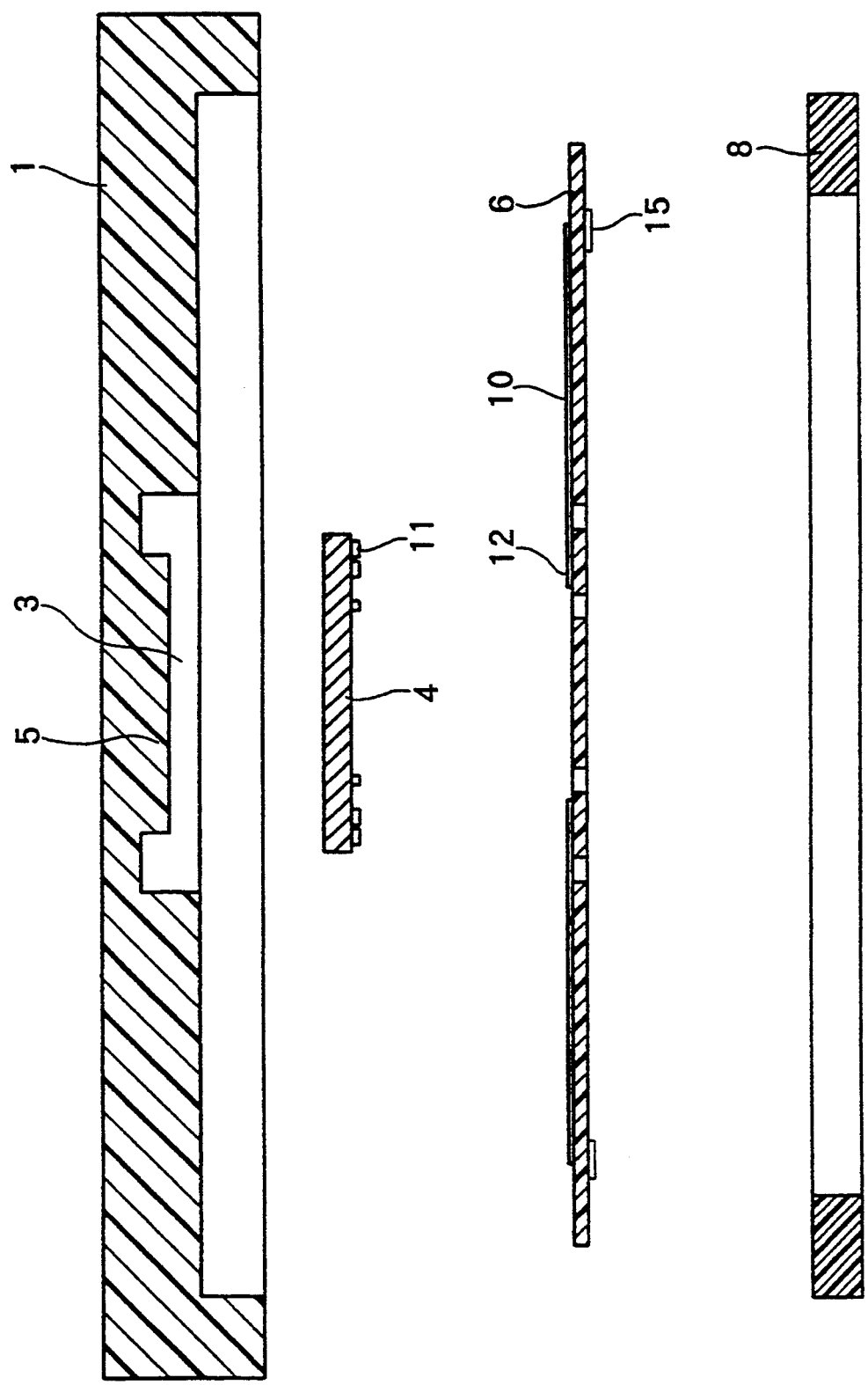

SOCKET FOR AN IC CARRIER HAVING A FLEXIBLE WIRING SHEET SUPERIMPOSED OVER AN IC BODY AND AN ELASTIC BACKUP MEMBER ELASTICALLY PRESSING THE FLEXIBLE WIRING SHEET INTO CONTACT WITH THE IC BODY

BACKGROUND OF THE INVENTION

1. Field of the Invention

This invention relates to a socket for an IC carrier, in which the IC carrier is loaded in the socket so that an IC held by the IC carrier may contact the socket.

2. Brief Description of the Prior Art

Recently, in an IC comprising a certain type of very small chip, IC contact pieces are arranged at very small pitches. Accordingly, it becomes difficult to physically contact the contact members of the socket directly to the IC contact pieces. The reason is that there is a limit in techniques for making the contact members have smaller dimensions and implanting the contact members in the socket at reduced pitches.

SUMMARY OF THE INVENTION

It is therefore a general object of the present invention to provide a socket for an IC carrier which is capable of obviating the above-mentioned problems inherent in the prior art.

According to the present invention, there is essentially provided a socket for an IC carrier in which the carrier has an IC body and a flexible wiring sheet superimposed on and contacted with the IC body, and the carrier is loaded in a socket so that the wiring sheet may contact the socket. The socket comprises an elastic backup member for elastically pressing the superimposing portion of the wiring sheet so as to contact with the IC body, and operating means for deflecting the elastic backup member between the pressing position and a press-releasing position.

By loading the IC body and the flexible wiring sheet forming the leads of the IC body on the carrier in superimposed relation as one piece, there can be provided a very thin unit to be connected, in which the lead pattern is widely spread. On the other hand, the contact members of the socket can be arranged at large pitches so as to be suitable for the lead pattern of the wiring sheet. In addition, the contact members of the socket can be made in a size having a required amount of elasticity and strength.

Since the wiring sheet is thin and flexible, its contacting state relative to the IC body tends to become unstable at the superimposing portion. However, according to the present invention, by pressing the superimposing portion between the wiring sheet and the IC body by with the backup member of the socket, the above-mentioned reliable contact can be obtained.

By deflecting the elastic backup member to the press-releasing position by the operation means provided on the socket, there can be realized a press-releasing condition between the IC body and the wiring sheet, and the assembly the (unit to be connected) comprising the IC carrier, the IC body and the wiring sheet can be re-loaded on the socket with no-load.

By forming the elastic backup member from an elastic plate or elastic wiring rod formed of metal material, the backup member can be effectively prevented from deteriorating due to heat and age. Therefore, a long-life can be obtained and reliability of the contact can be obtained.

BRIEF DESCRIPTION OF THE DRAWINGS

FIG. 2 is an exploded cross-sectional view of the IC carrier of FIG. 1(a);

DETAILED DESCRIPTION OF THE EMBODIMENTS

Several embodiments of the present invention will be described in great detail with reference to FIGS. 1 to 11.

Figure 1A:
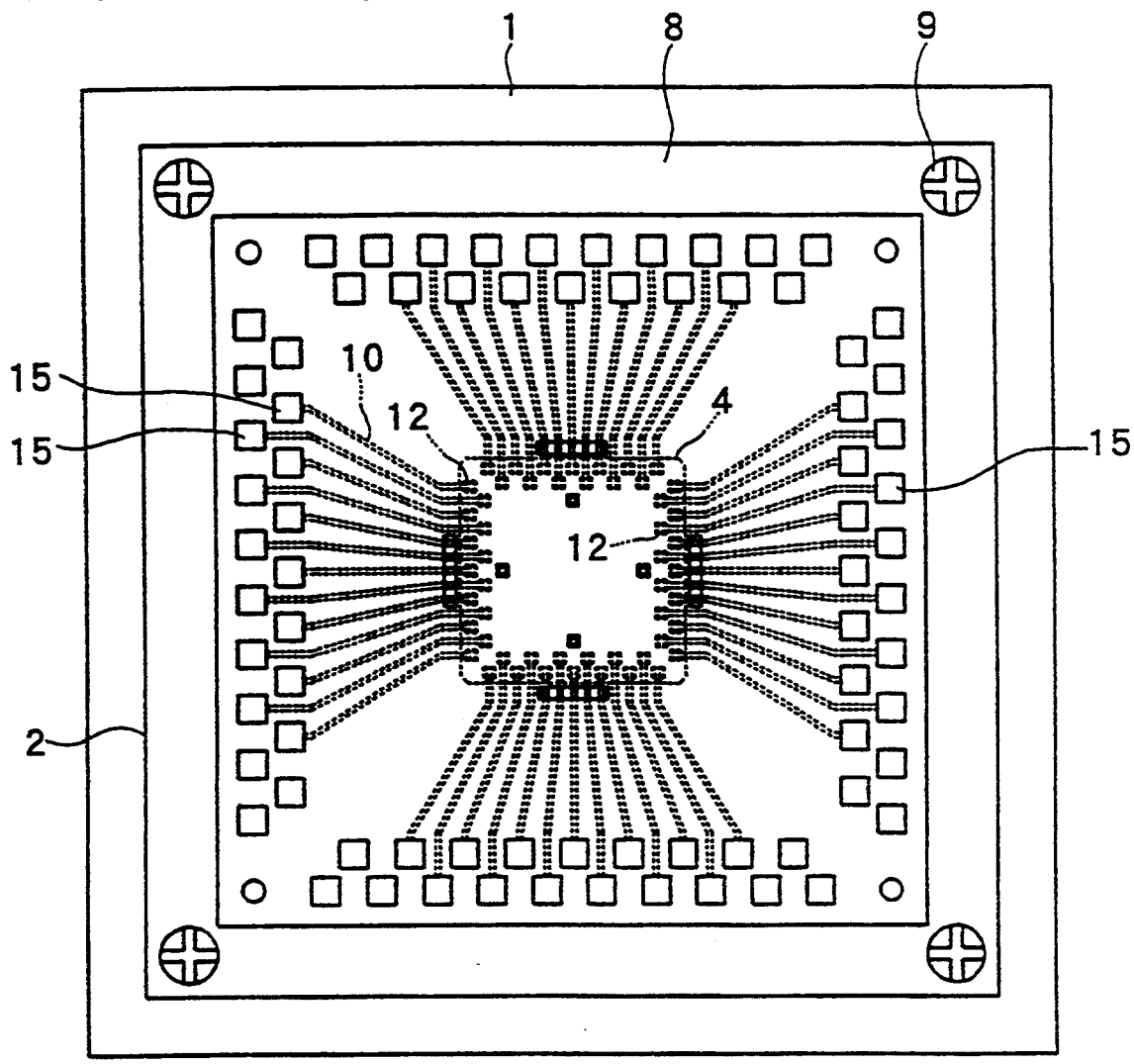
FIG. 1(A) is a plan view of an IC carrier and FIG. 1(B) is a cross-sectional view of the IC carrier of FIG. 1(A)
Figure 1B:
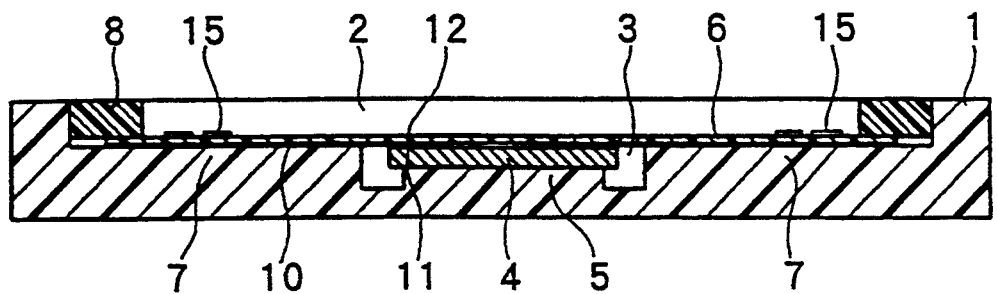

As shown in FIGS. 1 and 2, as well as elsewhere, a carrier 1, which is formed of an insulating material, has a planar square configuration and includes a square sheet receiving portion 2 having an open surface and an IC receiving portion 3 which is formed in a central portion of the sheet receiving portion 2 and open to the bottom of the sheet receiving portion 2. An IC body 4 is received in the IC receiving portion 3 and supported on a support seat 5 formed on an inner bottom surface of the IC receiving portion 3. A wiring sheet 6 is supported on a support seat 7 formed on a bottom surface of the sheet receiving portion 2.

The IC body 4 supported on the support seat 5 is held in contact relation or opposedly adjacent relation with the wiring sheet 6 supported on the support seat 7 at a central portion of the wiring seat 6. To realize the foregoing arrangement, it is designed such that the upper surface of the IC body 4 received in the IC receiving portion 3 is generally coplanar or flush with the upper surface of support seat 7.

The IC body 4 and the wiring sheet 6 are held in a superimposed relation relative to each other and assembled into one piece together with the carrier 1. As one means for assembling, as shown for example in FIGS. 1 and 2, as well as elsewhere, a frame 8 having generally the same dimensional size as the sheet receiving portion 2 is formed and fitted into the sheet receiving portion 2.

Corner portions of the frame 8 are tightly secured to the carrier 1 by screw means 9 or the like. By securing the wiring sheet 6 to the support seat 7 of the carrier 1, the IC body 4 is held between the sheet 6 and the support seat 5 of the carrier 1.

The wiring sheet 6 is formed of a flexible insulating material, such as synthetic resin film, and has on its upper surface a lead pattern corresponding to contact pieces 11 of the IC body 4. Leads 10 forming this lead pattern are intimately attached to the wiring sheet 6 by printing, for example, and radially extend so far as the peripheral portion from the central portion (the superimposed portion relative to the IC body 4) of the wiring sheet 6. The inner portions of the wiring sheet 6, extending so far as the superimposed portion, are provided with first contact pads 12 arranged at very narrow pitches and in such a manner as to correspond to the contact pieces 11 formed on the upper surface of the IC body 4. The outer portions of the wiring sheet 6, and extending as far as the peripheral portion of the wiring sheet 6, are provided with second contact pads 15, arranged at comparatively large pitches in such a manner as to correspond to contact members 14 of a socket body 13. That is, the lead pattern is such that the second contact pads 15 formed on the outer ends thereof are widely spread over the entire outer area of the IC body 4 and subjected to contact with the corresponding contact members 14.

The lead pattern is formed on the inner surface side where the wiring sheet 6 is in superimposed relation with the IC body 4. Similarly, the first contact pads 12 are also formed on the inner surface side where the wiring sheet 6 is in superimposed relation with the IC body 4. On the other hand, the second contact pads 15 are arranged in such a manner as to the be exposed to outside surface of the wiring sheet 6.

Figure 4:
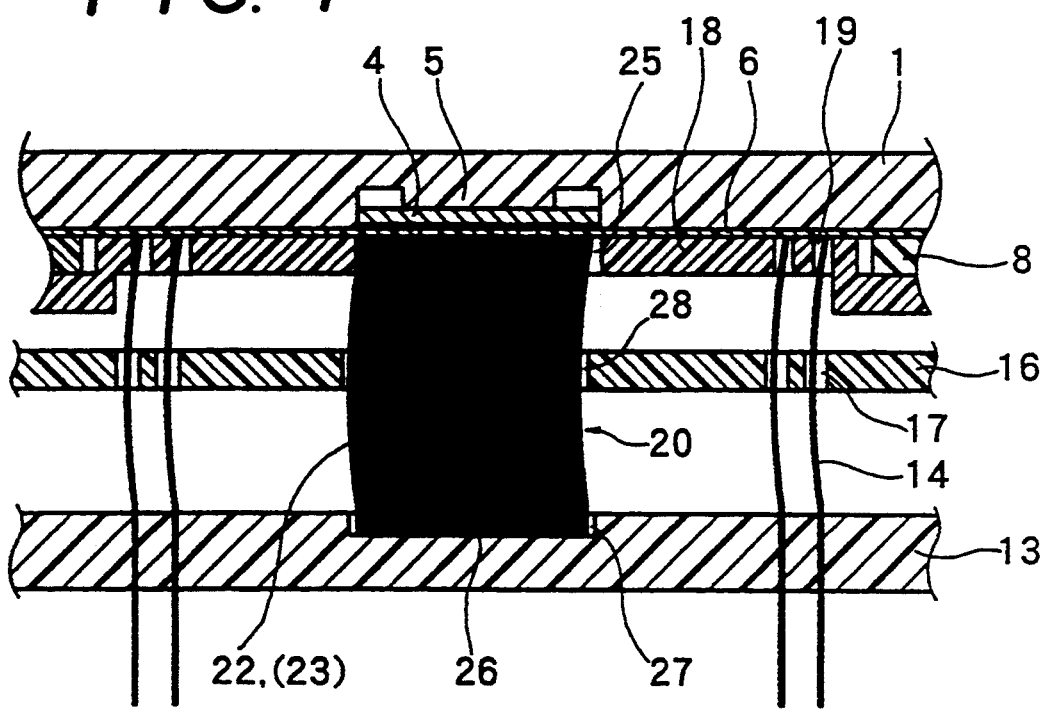
FIG. 4 is a cross-sectional view showing one concrete example of the contacting structure between the IC carrier and the IC socket.
Figure 7:
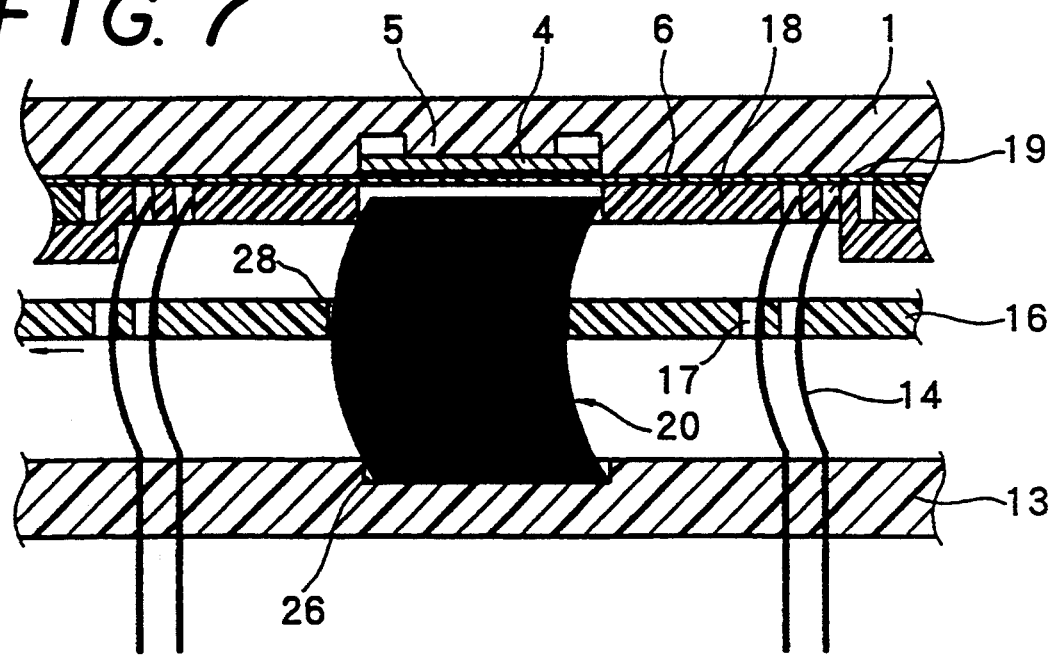
FIG. 7 is a cross-sectional view showing a disengagement condition or engagement-released condition between the IC carrier and the IC socket.
Figure 9:
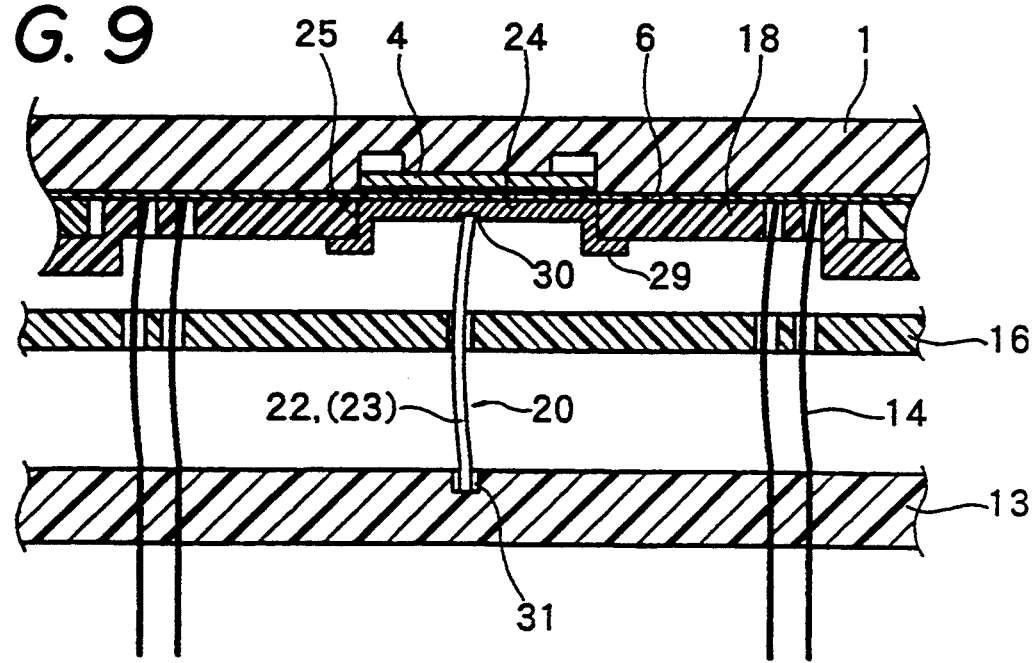
FIG. 9 is a cross-sectional view showing a contacting condition between an IC carrier and an IC socket according to another embodiment of the present invention.

As shown in FIGS. 4, 7 and 9, as well as elsewhere, a number of contact members 14 formed of electrically conductive single elongated plate material extend from a substrate acting as the socket body 13 are inserted into through-holes 17 formed in an operating plate 16, which can be moved horizontally. Distal ends of the contact members 14 passing through the through-holes 17 are received in corresponding holes 19 formed in a damping plate 18. This damping plate 18 is rigidly integral with the substrate 13. The operating plate 16 is horizontally movably disposed between the socket substrate 13 and the damping plate 18. The contact members 14 are loosely inserted into both the through-holes 17 of the operating plate 16 and the holes 19 of the damping plate 18.

Figure 8:
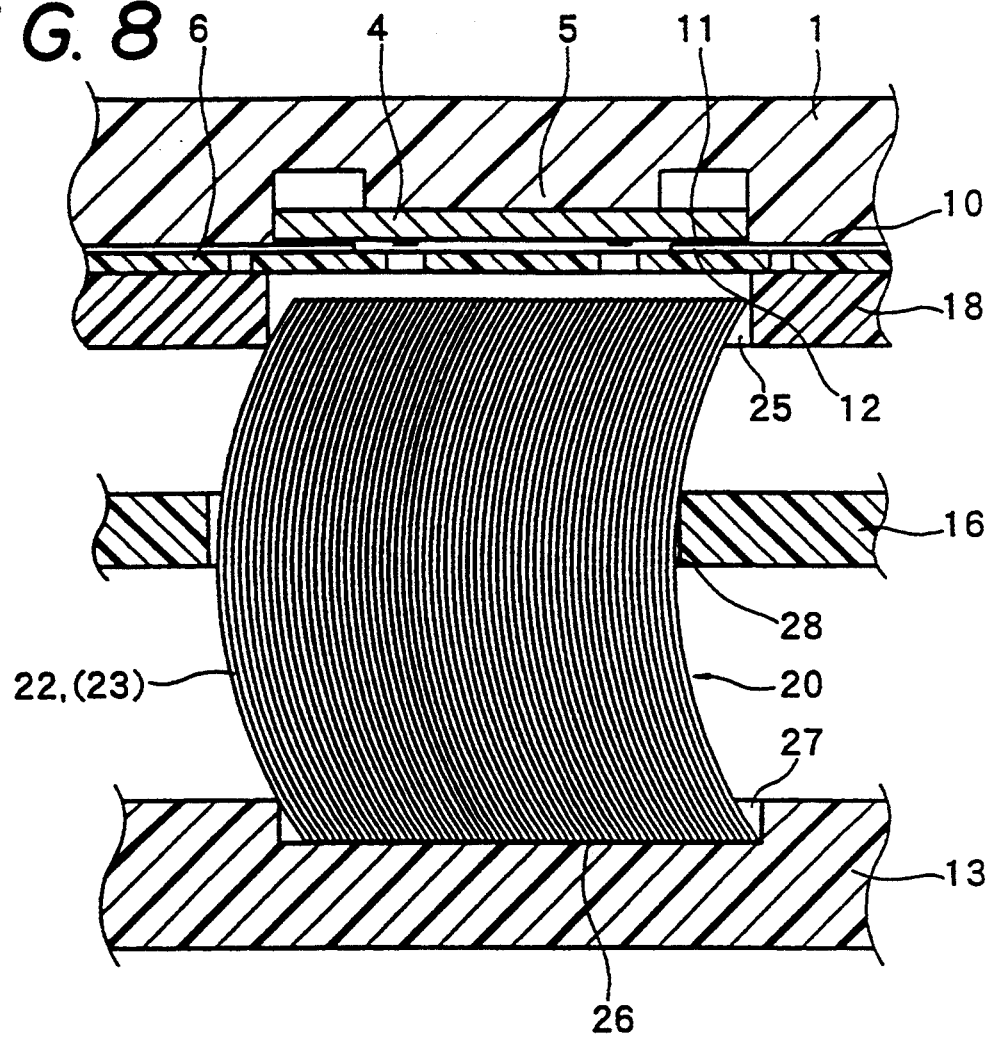
FIG. 8 is an enlarged cross-sectional view of FIG. 7.

As shown in FIGS. 7 and 8, when the operating plate 16 is horizontally moved in a single direction, the inner walls of the through-holes 17 press the contact members 14. As a result, the distal end portions of the contact members 14 are deflected while being supported by the inner walls of the holes 19 of the damping plate 18 and moved in a contracting direction within the holes 19 of the damping plate 18. As a consequence, the distal ends of the contact members 14 are brought away from the second contact pads 15 of the wiring sheet 6, thereby realizing a contact-releasing condition.

As shown in FIG. 4, when the operating plate 16 is horizontally moved in the other direction by a restoring force of the contact members 14, or when the contact members 14 are restored to their initial conditions by other suitable means than the contact members 14 for horizontally moving the operating plate 16, the contact members 14 are stretched, so that the distal ends of the contact members 3 may be brought into pressure contact with the corresponding second contact pads 15 of the wiring sheet 6 at the opening surfaces of the holes 19 of the damping plate 18 or at an extended position from the opening surfaces.

The socket having the above-mentioned construction is provided with an elastic backup member 20 for elastically pressing the superimposing portion of the wiring sheet 6 relative to the IC body 4 and also with an operation means for deflecting the elastic backup member 20 between the pressing position and the press-releasing position. The elastic backup member 20 has the function of elastically pressing the superimposed portion of the wiring sheet 6 relative to the IC body 4 in order to bring the first contact pads 12 of the wiring sheet 6 into pressure contact with the contact pieces 11 arranged on the superimposed area of the IC body 4.

Figure 3:
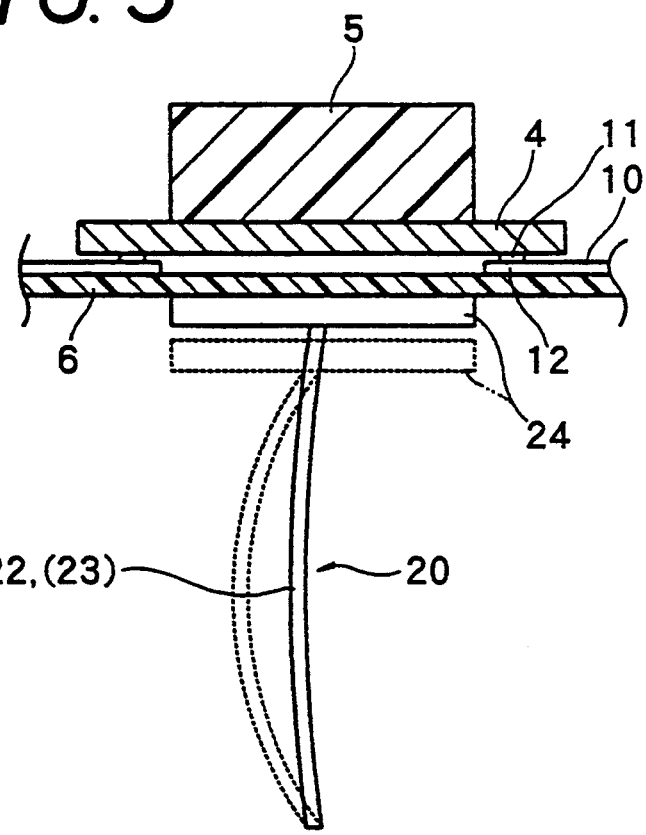
FIG. 3 is a cross-sectional view showing the principle of a contacting structure between the IC carrier and an IC socket.

As shown for example in FIG. 3, an elastic plate 22 or elastic wire rod 23 is erected upwardly so that it may be oriented in the shape of a letter "T" relative to the wiring sheet 6 and the distal end of the plate 22 or wiring rod 23 is disposed opposite to the superimposing portion of the wiring sheet 6. By deflecting the plate 22 or wiring rod 23 as indicated by the imaginary lines of FIG. 3, it is brought away from the wiring sheet 6 in order to remove the pressure, and by restoring the plate 22 or wiring rod 23 as indicated by the solid lines, the wiring sheet 6 is pressed so that the first contact pad 12 of the wiring sheet 6 may be urged against the contact piece 11 of the IC body 4 at the superimposed portion. It may be designed such that the elastic plate 22 or elastic wiring rod 23 is provided at its distal end with a presser plate 24 capable of ascending and descending, following the movement of the plate 22 or wiring rod 23, so that the superimposed portion of the wiring sheet 6 may be uniformly pressed with this presser plate 24. The elastic plate 22 or elastic wiring rod 23 is preferably formed of metal material.

Figure 5:
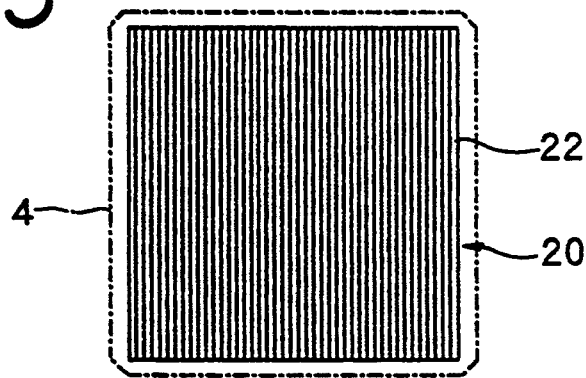
FIG. 5 is a plan view showing an elastic backup member.
Figure 6:
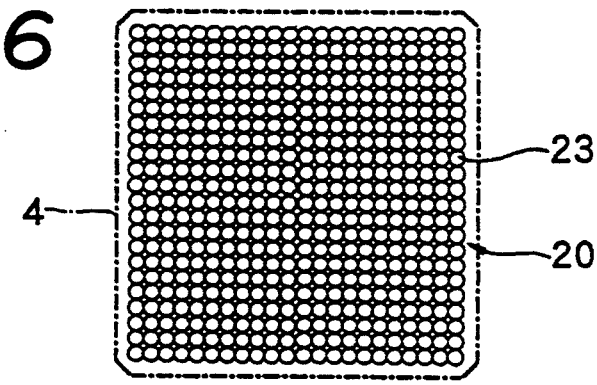
FIG. 6 is a plan view showing another example of an elastic backup member.

In the example shown in FIGS. 1 to 8, a number of elastic plates 22 or elastic wiring rods 23 are gathered together to form the above-mentioned backup member 20. As shown in FIG. 5, the elastic plates 22 are merely overlapped to form a square shape (in the case of the elastic wiring rods 23, they are merely gathered together to likewise form a square shape, as best seen in FIG. 6), and first ends thereof are inserted into an opening 25 formed all the way through the contact damping plate 18 with first end faces thereof placed opposite to the IC body 4, while the other ends thereof rest in a recess 26 formed in the substrate 13 with the end faces thereof supported on the inner bottom surface of the recess 26. The elastic backup member 20 is somewhat loosely received in the recess 26. Reference numeral 27 denotes a space or gap for allowing the elastic backup member 20 to be loosely received in the recess 26.

An intermediate portion of the elastic backup member 20 is pierced into and all the way through an opening 28 formed in the operating plate 16. This operating plate 16 serves as a means for displacing the contact members 14 and also as an operation means for deflecting the elastic backup member 20 between the pressing position and the press-releasing position. More specifically, as shown in FIGS. 7 and 8, when the operating plate 16 is horizontally moved in a single direction in parallel with both the socket substrate 13 and the contact damping plate 18, the contacts 14 are contracted, while being curvedly deflected, so as to be brought away from the second contact pads 15 as previously mentioned, and at the same time, the elastic backup member 20 is curvedly deflected by being pressed with the inner wall of the opening 28 of the operating plate 16 while being regulated by both the inner wall of the opening 25 of the damping plate 18 and the inner wall of the recess 27 of the socket substrate 13. As a result, the end face of the elastic backup member 20 is brought away from the upper surface of the wiring sheet 6 to remove the pressure.

As shown in FIG. 4, when the elastic backup member 20 is restored to thereby horizontally move the operating plate 16 in the other direction, or when the operating plate 16 is horizontally moved, by other suitable means, to restore the backup member 20, the contact members 14 are stretched to be brought into pressure contact with the second contact pads 15 as previously mentioned, and at the same time, the backup member 20 is stretched so that the outer surface of the superimposed portion of the wiring sheet 6 is pressed with the end face of the backup member 20. As a consequence, the first contact pads 12 of the wiring sheet 6 are pressed against the contact pieces 11 of the IC body 4, thereby realizing the pressure contact. At this time, the support seat 5 serves as a backing against the pressure applied to the IC body 4 on the opposite side thereof.

In a modified embodiment shown in FIG. 9, the presser plate 24 is supported by a single elastic plate 22 or elastic wiring rod 23 as in FIG. 3. The presser plate 24 is pushed into the opening 25 of the damping plate 18 by the force of the elastic plate 22 or elastic wiring rod 23, and the outer surface of the superimposed portion of the wiring sheet 6 is uniformly pressed by the outer surface of the presser plate 24. The presser plate 24 is fitted into the opening 25 in such a manner as to be able to move upwardly and downwardly. By causing a stopper 29 projecting from a side portion of the presser plate 24 to engage the edge portion of the opening 25, the presser plate 24 is limited in movement toward the wiring sheet 6, and at the same time, the presser plate 24 is prevented from being protruded in that direction.

One end of the elastic plate 22 or elastic wiring rod 23 is inserted into a recess 30 formed in a central portion of the bottom surface of the presser plate 24 so as to be elastically supported on the bottom surface of the recess 30, while the other end thereof is inserted into a recess 31 formed in the socket substrate 13 so as to be elastically supported on the bottom surface of the recess 31. Accordingly, the elastic plate 22 or elastic wiring rod 23 is compressed between the presser plate 24 and the socket substrate 13 to accumulate elasticity.

In the same manner previously mentioned, the elastic plate 22 or elastic wiring rod 23 is pierced into the operating plate 16. By horizontally moving this operating plate 16 in a single direction, the elastic plate 22 or elastic wiring rod 23 is deflected to remove the contacting condition. On the other hand, by restoring the elastic plate 22 or elastic wiring rod 23, the presser plate 24 is pushed up to press the superimposed portion of the wiring sheet 6.

Figure 10:
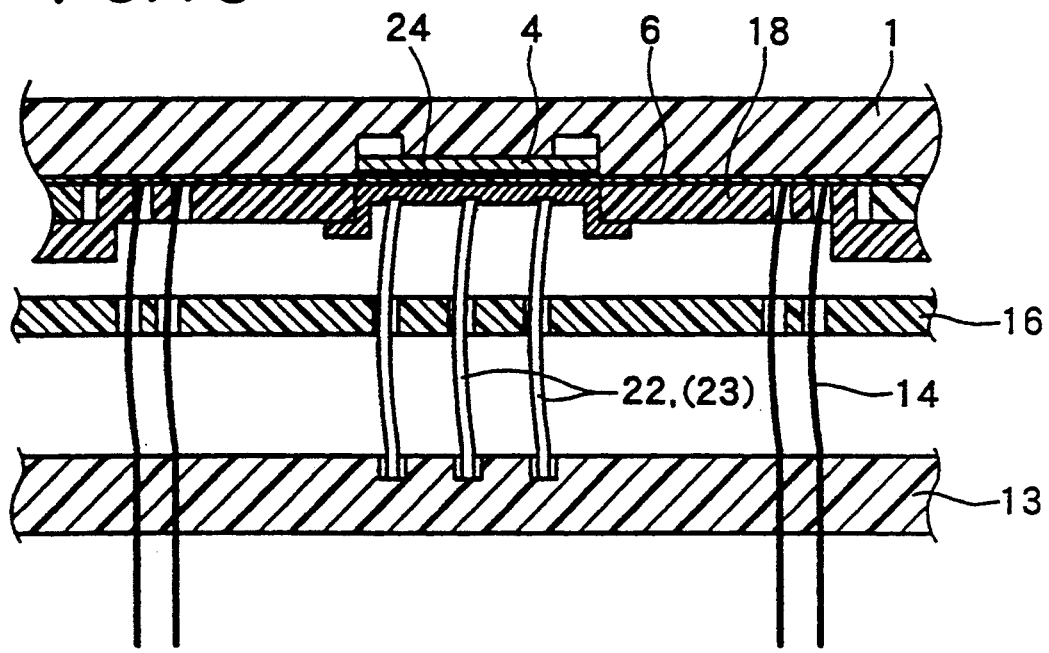
FIG. 10 is a cross-sectional view showing a contacting condition between an IC carrier and an IC socket according to a further embodiment of the present invention.

In another modified embodiment in FIG. 10, the elastic backup member 20 is formed by a limited number of elastic plates 22 or elastic wiring rods 23 (for example, two or three plates or rods). The elastic plates 22 or elastic wiring rods 23 are not overlapped with each other. The elastic plates 23 or elastic wiring rods 23 are disposed such that they support the presser plate 24 at a central portion and opposite end portions of the presser plate 24. The elastic plates 22 or elastic wiring rods 23 are expanded and contracted by the operating plate 16 being horizontally moved, so that the presser plate 24 may be ascended and descended between the pressing position and the press-releasing position. The description made with reference to FIGS. 3 and 9 is applicable also to FIG. 10.

Figure 11:
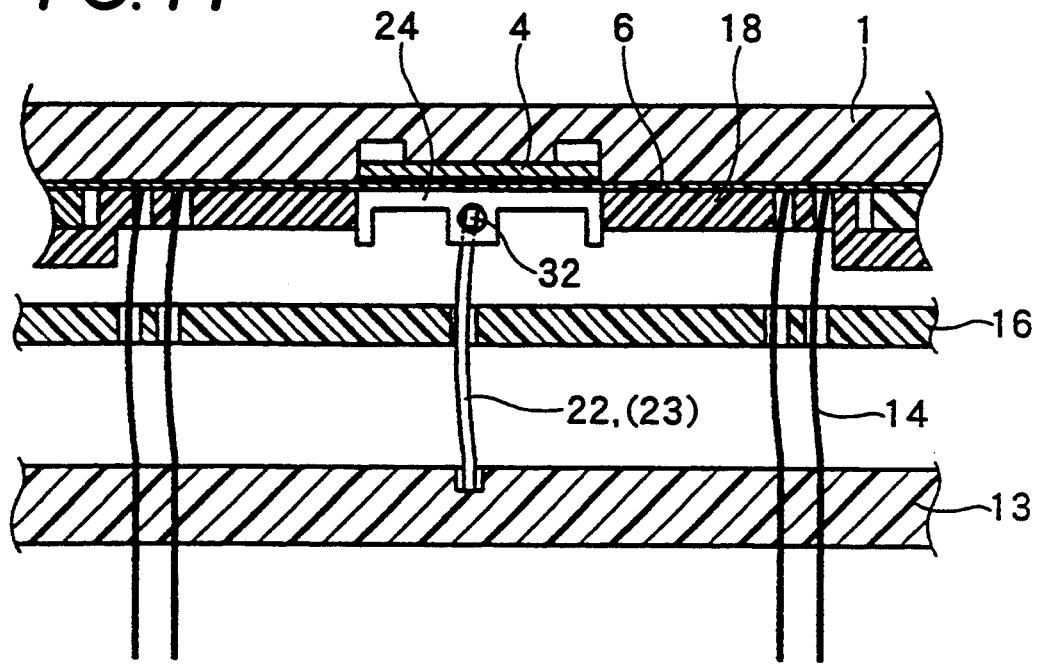
FIG. 11 is a cross-sectional view showing a contacting condition between an IC carrier and an IC socket according to a still further embodiment of the present invention.

In still another modified embodiment shown in FIG. 11, the presser plate 24 is supported by one end of the elastic plate 22 or elastic wiring rod 23. The presser plate 24 is pivotally supported by one end of the elastic plate 22 or elastic wiring rod 23 through a shaft or pin 32. That is, the method for supporting the presser plate 24 may be chosen; the presser plate 24 may be supported by the elastic plate 22 or elastic wiring rod 23 by merely abutting one end thereof against the presser plate 24, or the presser plate 24 may be pivotally supported by the shaft or pin as shown in FIG. 11.

In the case where the construction shown in FIG. 11 is employed, since the elastic plate 22 or elastic wiring rod 23 is connected by the pin 32, the stopper 29 of FIG. 9 can be omitted. The method of FIG. 11 is effective when a single elastic plate 22 or wiring rod 23 is used. For example, if a single elastic plate 22 is used, the elastic plate 22 may be provided with a projection. In that case, a hole for receiving the projection is formed in a central portion of the presser plate 24, so that the projection may be pivotally inserted into this hole.

In the embodiments shown in FIGS. 9, 10 and 11, the wiring sheet 6 is effectively pressed by a combination of a single or a limited number of the elastic plates 22 or elastic wiring rods 23 with the presser plate 24. In the embodiments shown in FIGS. 4 to 8, a number of elastic plates 22 or elastic wiring rods 23 are gathered together to form the pressing area of the wiring sheet 6 without using the presser plate 24.

The elastic backup member 20 may be formed of elastic material such as a rubber block. In that case, the elastic backup member 20 is contracted or restored by a suitable operation means in order to press the wiring sheet 6 or remove the pressure therefrom.

According to the present invention, the IC body and the wiring sheet forming the leads of the IC body are carried on the carrier in superimposed relation, and this whole body serves as a unit to be connected. Owing to the foregoing arrangement, the small pitch arrangement of the contact pieces in the carrier can be enlarged in pitch, and in addition, the area where the contact pieces are arranged can be widely expanded. This makes it possible to design the corresponding contact members of the socket at comparatively large pitches, and also to increase the elasticity of the contact members. As a result, the conditions for making the contact members can be tremendously eased.

Since the wiring sheet to be superimposed on the IC body is thin, bulkiness of the whole unit can be avoided. Since the wiring sheet is flexible, its contacting state relative to the IC body tends to become unstable. However, as previously mentioned, by means of a provision of a pressing means consisting of the elastic backup member for pressing the wiring sheet at the superimposed portion relative to the IC body, a reliable contact between the IC body and the wiring sheet can be obtained.

By using an elastic plate or elastic wiring rod formed of metal material as the above elastic backup member, thermal deterioration and change due to aging can be effectively prevented, thereby enhancing reliability of the contact between the IC body and the wiring sheet.

While specific embodiments of the present invention have been shown in the drawings and described above, it will be apparent that many changes may be made in the form, arrangement, and positioning of the various component elements. In consideration thereof, it should be understood that preferred embodiments of this invention disclosed herein are intended to be illustrative only, and are not intended to limit the scope of the invention.

What is claimed is:

1. A socket and IC carrier arrangement, comprising:
   an IC carrier having an IC body thereon, said IC body having a plurality of contact pieces thereon;
   a flexible wiring sheet superimposed on and contacted with said IC body, said flexible wiring sheet having leads thereon each having a first contact pad disposed on a superimposed portion of said flexible wiring sheet and a second contact pad disposed outside of said superimposed portion, and each of said leads contacting corresponding ones of said contact pieces of said IC body with said first contact pads; and
   a socket having said IC carrier therein, said socket comprising an elastic backup member for elastically pressing said superimposed portion of said wiring sheet into contact with said IC body in a pressing position and releasing pressure on said superimposed portion in a pressure-release position, an operator for deflecting said elastic backup member between said pressing position and said pressure-release position, and contact members for contacting respective ones of said second contact pads.

2. A socket and IC carrier arrangement, comprising:
   an IC carrier having an IC body thereon;
   a flexible wiring sheet superimposed on and contacted with said IC body; and
   a socket having said IC carrier therein, said socket comprising an elastic backup member for elastically pressing said superimposed portion of said wiring sheet into contact with said IC body in a pressing position and releasing pressure on said superimposed portion in a pressure-release position, and an operator for deflecting said elastic backup member between said pressing position and said pressure-release position, wherein said elastic backup member comprises an elastic plate or elastic wire rod and said superimposed portion of said wiring sheet is pressed by one end portion of said elastic plate or elastic wire rod in said pressing position.

3. The arrangement of claim 2, wherein said elastic plate or elastic wire rod has a pressing plate between said one end portion thereof and said superimposed portion.

4. The arrangement of claim 2, wherein said elastic backup member comprises a plurality of elastic plates or a plurality of elastic wire rods.

5. A socket and IC carrier arrangement, comprising:
   an IC carrier having an IC body thereon;
   a flexible wiring sheet superimposed on and contacted with said IC body such that said flexible wiring sheet has a superimposed portion thereof overlying said IC body; and
   a socket having said IC carrier therein, said socket comprising an elastic backup member movable between a pressing position elastically pressing said superimposed portion of said wiring sheet into contact with said IC body and a pressure release position releasing pressure on said superimposed portion and an operator connected with said elastic backup member.

6. The arrangement of claim 5, wherein said socket further comprises a socket substrate and a damping plate that are rigid relative to each other, said damping plate having an opening therein and said elastic backup member engaging said socket substrate with one end thereof and extending into said opening with the other end thereof.

7. The arrangement of claim 6, wherein said operator extends between and is movable relative to said socket substrate and said damping plate.

8. The arrangement of claim 7, wherein said operator has a hole therethrough and said elastic backup member comprises an elastic metal member extending through said hole.

9. The arrangement of claim 6, wherein said elastic backup member has a presser plate disposed in said opening of said damping plate for engaging said flexible wiring sheet.

10. The arrangement of claim 6, and further comprising a plurality of elastic contacts mounted in said socket substrate and engageable and disengageable with said flexible wiring sheet upon operation of said operator.

11. The arrangement of claim 5, wherein said elastic backup member comprises an elastic plate.

12. The arrangement of claim 5, wherein said elastic backup member comprises an elastic wire rod.

13. The arrangement of claim 5, wherein said elastic backup member comprises a plurality of elastic plates.

14. The arrangement of claim 5, wherein said elastic backup member comprises a plurality of wire rods.

15. The arrangement of claim 5, wherein said elastic backup member comprises a presser plate disposed in said opening of said damping plate for engaging said flexible wiring sheet.

16. The arrangement of claim 5, wherein contact pads on said flexible wiring sheet are pressed into contact with contact pieces on said IC body in said pressing position.

* * * * *